(12) United States Patent
Joshi et al.

(10) Patent No.: US 8,606,557 B2
(45) Date of Patent: Dec. 10, 2013

(54) TABLE LOOKUP METHOD FOR PHYSICS BASED MODELS FOR SPICE-LIKE SIMULATORS

(75) Inventors: Rajiv V. Joshi, Yorktown Heights, NY (US); Rouwaida N. Kanj, Round Rock, TX (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 12/698,759

(22) Filed: Feb. 2, 2010

(65) Prior Publication Data

US 2011/0191091 A1 Aug. 4, 2011

(51) Int. Cl.
*G06F 17/50* (2006.01)
*G06G 7/62* (2006.01)

(52) U.S. Cl.
USPC .......................................................... 703/13

(58) Field of Classification Search
USPC .......................................................... 703/13
See application file for complete search history.

(56) References Cited

U.S. PATENT DOCUMENTS

| | | | |
|---|---|---|---|
| 5,568,395 A * | 10/1996 | Huang ........................... | 716/102 |
| 5,687,088 A * | 11/1997 | Tomita ............................ | 703/15 |
| 5,901,063 A * | 5/1999 | Chang et al. ................... | 716/115 |
| 6,185,722 B1 * | 2/2001 | Darden et al. ................. | 716/115 |
| 6,269,472 B1 | 7/2001 | Garza et al. | |
| 6,395,438 B1 * | 5/2002 | Bruce et al. ..................... | 430/30 |
| 6,615,164 B1 | 9/2003 | Gopisetty et al. | |
| 6,732,341 B1 * | 5/2004 | Chang et al. ................... | 716/108 |
| 6,804,810 B1 * | 10/2004 | Petersen et al. ............... | 716/113 |
| 6,859,915 B1 * | 2/2005 | Frank et al. .................... | 716/112 |
| 6,912,702 B1 | 6/2005 | Iyer et al. | |
| 7,093,226 B2 | 8/2006 | Pang | |
| 7,337,100 B1 | 2/2008 | Hutton et al. | |
| 7,365,605 B1 * | 4/2008 | Hoover .......................... | 330/301 |
| 7,424,697 B1 | 9/2008 | Arslan et al. | |
| 7,444,275 B2 * | 10/2008 | Carelli, Jr. ..................... | 703/14 |
| 8,041,552 B2 * | 10/2011 | Pilling ............................ | 703/14 |
| 2003/0079191 A1 | 4/2003 | Savithri et al. | |
| 2004/0049745 A1 | 3/2004 | Rahman et al. | |
| 2008/0123459 A1 | 5/2008 | Rajan et al. | |
| 2010/0257493 A1 * | 10/2010 | Agarwal et al. ................... | 716/4 |

OTHER PUBLICATIONS

Bourenkov et al, MOS Table Models for Circuit Simulation, Mar. 2005, 352 IEEE Transactions on Computer-Aided Design of Integrated Circuits and Systems, vol. 24, No. 3, Mar. 2005, 11 pages.*
Cheng, A Fast Method for MOS Model Evaluation in VLSI Simulation with Controllable Error, China 1991 International Conference on Circuits and Systems, Jun. 1991, Shenzhen, China, 4 pages.*

(Continued)

*Primary Examiner* — Mary C Jacob
*Assistant Examiner* — Aniss Chad
(74) *Attorney, Agent, or Firm* — Preston Young; Michael J. Chang, LLC

(57) ABSTRACT

Techniques for electronic circuit design simulation are provided. In one aspect, a method for electronic circuit design simulation includes the following steps. A model (e.g., a physics-based model) of the circuit design is created. Error tables are created containing data related to one or more regions of the circuit design. The model is modified with data from the error tables. The modified model is used to simulate the circuit design.

18 Claims, 5 Drawing Sheets

(56) References Cited

OTHER PUBLICATIONS

Cheng, Yuhua et al, "Physical and Scalable I-V Model in BSIM3v3 for Analog/Digital Circuit Simulation", IEEE Transactions on Electron Devices, vol. 44, No. 2, Feb. 1997.*

Wan et al., "Hierarchical Multi-Dimensional Table Lookup for Model-Compiler-Based Circuit Simulation," Computers and Digital Techniques, IEE Proceedings, vol. 152, Issue 1, pp. 39-44 (Jan. 2005).

So et al., "CAD of E-Plane Circuits with Field-Theory Based Lookup Tables and Discontinuity Models," Microwave Symposium Digest, 1988, IEEE MTT-S International May 25-27, vol. 1, pp. 335-338 (1988).

A. Rofougaran et al., "A Table Lookup FET Model for Accurate Analog Circuit Simulation," IEEE Trans. CAD, vol. 12, No. 2, pp. 324-335 (Feb. 1993).

S.K. Lam et al., "A Linear Approximation Based Hybrid Approach for Binary Logarithmic Conversion," Microprocessors and Microsystems 26, pp. 353-361 (2002).

* cited by examiner

400

500

600

700

800

900

1000

TABLE LOOKUP METHOD FOR PHYSICS BASED MODELS FOR SPICE-LIKE SIMULATORS

FIELD OF THE INVENTION

The present invention relates to electronic circuit designs, and more particularly, to techniques for electronic circuit design simulation.

BACKGROUND OF THE INVENTION

In the present and future technology generations, fast and accurate circuit simulations and analysis are required to capture rapidly-changed device features, intrinsic device fluctuation and random mismatch among adjacent devices. Numerical device simulations (e.g., technology computer-aided design (TCAD), such as Synopsys TCAD available from Synopsys, Inc., Mountain View, Calif.) are based on physical drift-diffusion or hydrodynamic transports which are partial differential equations and are accurate. However, simulation run-time is significantly slow for circuit-level simulations. Table-look-up based circuit analysis is very fast, but table-look-up methods are not accurate due to many interpolated regions. See, for example, A. Rofougaran et al., "A Table Lookup FET Model for Accurate Analog Circuit Simulation," IEEE Trans. CAD, vol. 12, no. 2, pp. 324-335 (February 1993). Simulation program with integrated circuit emphasis (SPICE), a traditional circuit simulator, is also widely used. However, due to non-linear and discontinuous field-effect transistor (FET) characteristics, only limited accuracy can be offered to circuit design. Also, reliable SPICE models are not available in the early stages of the design process (and/or before hardware data is available), and the development of models takes a long time and involves many complex steps.

Thus, TCAD simulations involve extensive amounts of computational time which cannot be directly used in circuit simulations. Complementary metal-oxide semiconductor (CMOS) technologies (including static random access memory (SRAM)) are getting more complex and thus it is becoming more difficult to predict performance/power and yield of these circuits. SPICE (i.e., an algebraic equation-based model) is fast and predictable, but still exhibits discrepancies between model and hardware (or extensive numerical simulations). A look-up table based tool is faster but not accurate due to many interpolations.

Therefore, circuit simulation techniques that are both fast and accurate would be desirable.

SUMMARY OF THE INVENTION

The present invention provides techniques for electronic circuit design simulation. In one aspect of the invention, a method for electronic circuit design simulation includes the following steps. A model (e.g., a physics-based model) of the circuit design is created. Error tables are created containing data related to one or more regions of the circuit design. The model is modified with data from the error tables. The modified model is used to simulate the circuit design.

A more complete understanding of the present invention, as well as further features and advantages of the present invention, will be obtained by reference to the following detailed description and drawings.

DETAILED DESCRIPTION OF PREFERRED EMBODIMENTS

Provided herein are self-consistent look-up table-based techniques that may be employed to analyze error between model/equation and data using physical (or mathematical) models and "error" look-up. The present techniques are more accurate and efficient in characterizing circuits and predicting yield than those described above. Fast estimations can be provided due to physical relations for parameter variations such as supply voltage ($V_{DD}$), output voltage (Vcs), gate length (L), gate width (W) and temperature. Further, the present techniques can be integrated into simulation program with integrated circuit emphasis (SPICE)-like circuit simulators.

Figure 1:
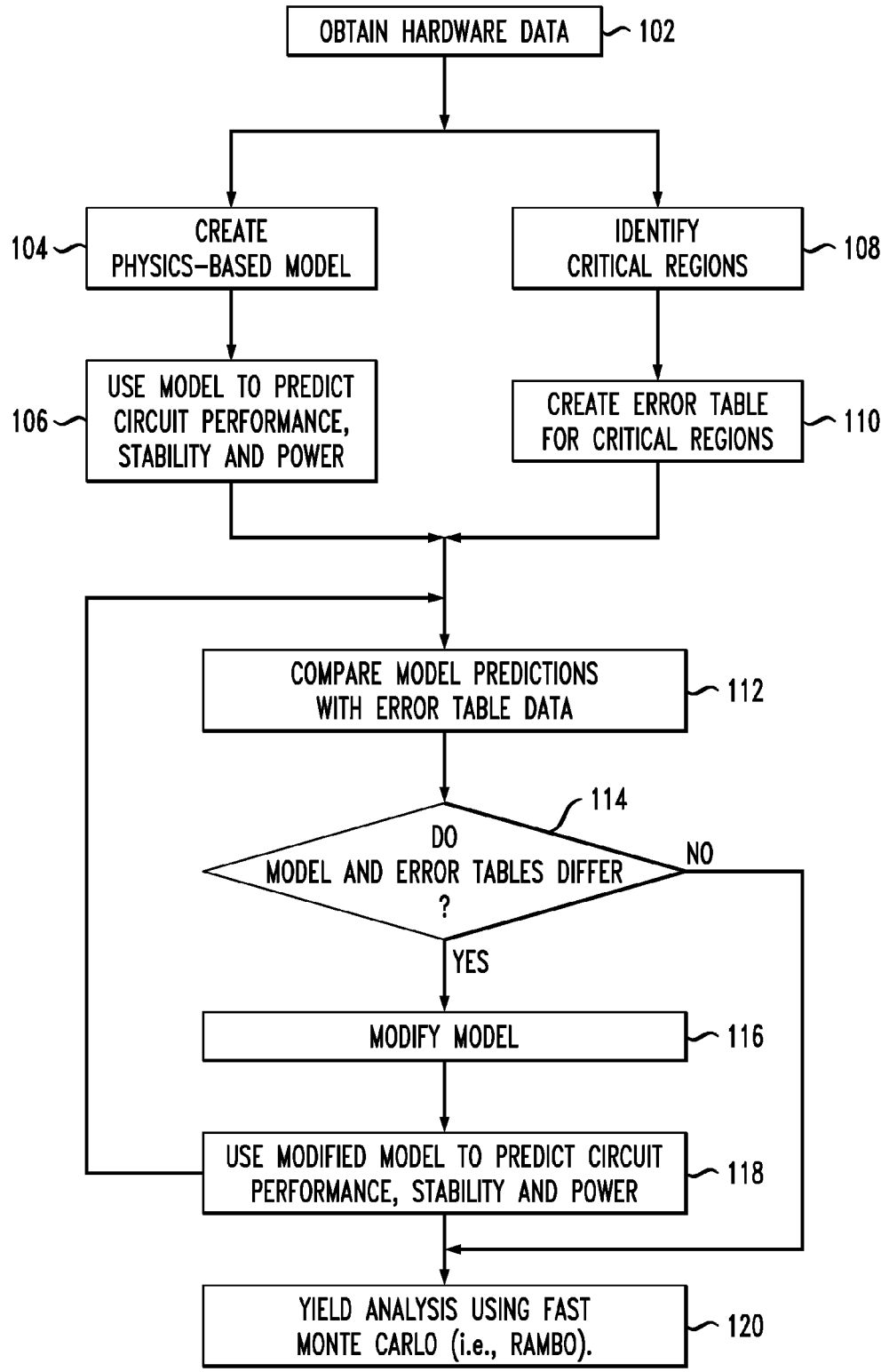
FIG. 1 is a diagram illustrating an exemplary methodology for electronic circuit design simulation according to an embodiment of the present invention.

Specifically, FIG. 1 is a diagram illustrating exemplary methodology 100 for electronic circuit design simulation. The present techniques are generally applicable to the simulation of any electronic circuit design, including, but not limited to, static random access memory (SRAM) circuits, embedded dynamic random access memory (eDRAM) circuits and logic circuits. In step 102, data related to the circuit design is obtained. The data obtained in this step can include, but is not limited to, data related to transistors, capacitors, resistors, and other hardware that are included in the circuit design. Of course, the data of particular relevance varies depending on the given design at hand.

The data obtained and the techniques used for obtaining the data are equivalent to what would be employed in conjunction with a conventional circuit simulator and thus are known to those of skill in the art. It is notable, however, that the data obtained at this step is reliable (i.e., is as close as possible to real hardware data), and thus contributes to the overall accuracy of the instant techniques. The reason the data here is 'reliable' is because it is being obtained based on actual known specifications of the design. By way of example only, a circuit designer can provide the relevant data based on his/her proscribed specifications for the design.

In step 104, a model is created based on the data obtained in step 102. According to an exemplary embodiment, the model is a physics-based model. As will be described in detail below, the model will be used to simulate the circuit design.

Thus, any conventional physics-based model can be employed with the understanding that the data in the model will be supplemented in certain "critical" regions of the design (see below) with data from "compact" error look-up tables, also referred to herein simply as error tables (i.e., the error tables are "compact" in the sense that data in the error tables relates to the critical regions, as opposed to the entire design). Thus, the physics-based model tool chosen can be relatively fast (as compared with other conventional circuit modeling tools) in terms of run-time with any trade-offs in accuracy being supplemented by data from the compact error tables.

By way of example only, suitable models for use in this step include, but are not limited to, physics-based models with algebraic equations, such as PSP (a surface-potential-based model), HiSIM and UFSOI models, and SPICE models with empirical parameters and algebraic equations, such as the BSIM model. Such models and the implementation thereof are known to those of skill in the art and thus are not described further herein. According to an exemplary embodiment, the present techniques employ a SPICE model in typical regions for which the model is optimized and a modified SPICE model in critical regions that have error.

In step 106, the model is used to predict behaviors or attributes of the circuit design, such as performance, stability and power. By way of example only, if the circuit design contains a plurality of transistors, then the model can be used in this step to predict switching behavior of the transistors. Of course, the attributes of particular relevance vary depending on the design at hand, and given the present teachings could be easily ascertained by one of skill in the art. It is notable that the model, however, can only provide limited accuracy in predicting these design attributes. Namely, discrepancies are known to typically exist between physics-based models and actual hardware. See, for example, the description of FIG. 2, below.

For instance, physics-based models use smoothing functions to reduce error. The result is a best theoretical fitting for a single, i.e., device, in a certain processing condition. Typically, one smoothing function is used to reduce the number of parameters involved. This is disadvantageous because error increases significantly under different operating conditions. See, for example, FIG. 2 (described below), wherein it is shown that error or discrepancy in a moderate inversion region of a transistor can be dependent upon operating variations of the device. Thus, the same smoothing function cannot be used for different regions of the design.

With the present techniques, however, the 'shortcomings' of these conventional physics-based models are corrected-for using the compact error tables. This aspect of the present techniques is described in further detail below.

In step 108, "critical" regions of the circuit design are identified. As highlighted above, the model (of steps 104 and 106) will likely fit well in certain desired regions of the design (such as weak and strong inversion regions (see below)), but will inevitably miss other regions (such as supply voltage ($V_{DD}$), drain-source voltage ($V_{DS}$), gate length (L), etc.) primarily because a single smoothing function is typically used in order to minimize the number of parameters used in the model. According to an exemplary embodiment, these missed regions (also referred to herein as "correction regions," or "regions of error"), which are specific for different types of models and are well-known to those of skill in the art, constitute the "critical" regions in this step. Alternatively, in another exemplary embodiment, the "critical" regions can constitute any region(s) of the design that are most critical for manufacturing yield. Again, such regions could be easily identifiable by one of skill in the art. Not all regions of the design are critical regions.

In step 110, error look-up tables, or simply error tables, are created with data relating to the "critical" regions of the circuit design identified in step 108. The term "error table" refers to the fact that the tables will be used to correct "errors" in the model, e.g., vis-à-vis the correction regions (see above). These error tables are "compact" in the sense that they are generally much smaller (i.e., contain less data) than the full-table models known in the art because the present error tables relate to the "critical" regions of the design, as opposed to the entire design, and are to be used in conjunction with the model (created in step 104, described above). By way of example only, in the case of SRAM, eDRAM and/or logic circuit designs, the error tables can contain data relating to gate-source voltage ($V_{GS}$), drain-source voltage ($V_{DS}$), drain-source current ($I_{DS}$) and operating temperature.

In step 112, the model predicted values (from step 106) are compared with the error table data. In hardware implementations of the present techniques (see, for example, FIG. 10, described below), this step can be performed by way of a conventional comparator, the design and operation of which is known to those of skill in the art. Since only the "critical" regions will be compared at this step, only minimal computation time is needed.

In step 114, a determination is made as to whether the model predictions differ from the error table data. By way of example only, if the model predicted values are above/below the error table values by more than a pre-defined amount (for example, five percent (%)), then the model predictions can be considered to be different from the error table data. This error factor of five % is merely exemplary and could be higher or lower depending on the particular design, however, for most complementary metal-oxide semiconductor (CMOS) simulation applications five % would be applicable. If the model predictions vary from the error table data (which is likely), then in step 116, the model is modified with the relevant data from the error tables. Then in step 118, the modified model is used to predict behaviors or attributes of the circuit design, such as was described in conjunction with the description of step 106, above. Steps 112-118 can then be repeated until there is agreement between the model predictions and the error table data. Once a consensus is reached, then in step 120, yield analysis is conducted using a conventional fast Monte Carlo technique, such as RAMBO. As shown in FIG. 1 if, on the other hand, at step 114 the model predictions do not vary from the error table data, then the process can proceed directly to yield analysis (step 120). The process by which the error tables are used to fix errors in the physics-based model are described in further detail in conjunction with the description of FIG. 4, below.

The proposed "compact" error-based model has the advantage of covering full device characteristics with less data available for modeling while it does not involve large tables. This analysis-specific model enhancement maintains the ability of compact models (SPICE, for example, is a compact (circuit simulator) model because it uses compact (i.e., algebraic) equations) to capture most regions well and it improves critical regions of compact model by relying on compact error tables. Used regions are critical for a certain behavior/analysis to be determined. Selected regions can be covered by compact tables. They would involve those regions that are most critical for manufacturing yield. Thus, its result is more physical compact models with good accuracy in critical regions by relying on compact error tables.

Figure 2:
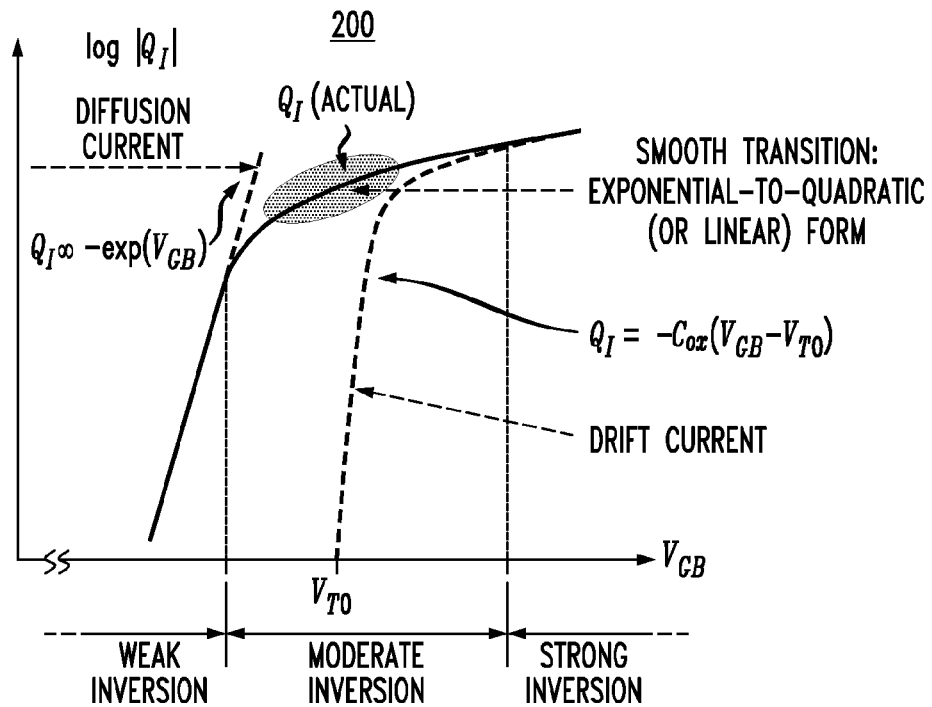
FIG. 2 is a graph illustrating direct current (DC) characteristics of a complementary metal-oxide semiconductor (CMOS) device according to an embodiment of the present invention.

FIG. 2 is a graph 200 illustrating direct current (DC) characteristics of a CMOS (i.e., metal oxide semiconductor field-effect transistor (MOSFET)) device. In graph 200, drain current $Q_1$ is plotted versus gate voltage ($V_{GB}$) characteristics. FIG. 2 shows that there are three operating conditions in a FET device, i.e., weak inversion, moderate inversion and strong inversion. In weak inversion, drain current $Q_1$ is exponentially dependent on gate voltage $V_{GB}$, i.e., $Q_1 \propto -\exp(V_{GB})$. In strong inversion, drain current $Q_1$ is linear or quadratic with respect to gate voltage changes, i.e., $Q_1 = -C_{ox}(V_{GB} - V_{T0})$, wherein $C_{ox}$ is gate-oxide capacitance and $V_{T0}$ is threshold voltage for low drain-source voltage ($V_{DS} \sim 0.05$ volts (V)).

Between the weak inversion and strong inversion regions there is a moderate inversion region wherein numerical and empirical models/analysis are required. Error or discrepancy in this moderate inversion region can be dependent upon operating variations of the device. Under different supply voltages and process variation, an amount and/or distribution of error can be changed, which illustrates one of the shortcomings of conventional physics-based models. As highlighted above, the same interconnecting function/model cannot be used for different regions.

Specifically, it is apparent from FIG. 2 that a small error in V translates to exponential error in current. Thus, conventional techniques used to minimize the number of parameters rely on interconnecting functions which fit well in desired regions, but can miss other regions such as changes of supply voltage ($V_{DD}$), channel-source current (Ics), gate length (L) and temperature. In contrast, the present techniques rely on error table-look-up in critical regions where the error is important. As described above, the present techniques can be used to determine what regions of the model require error correction.

Figure 3:
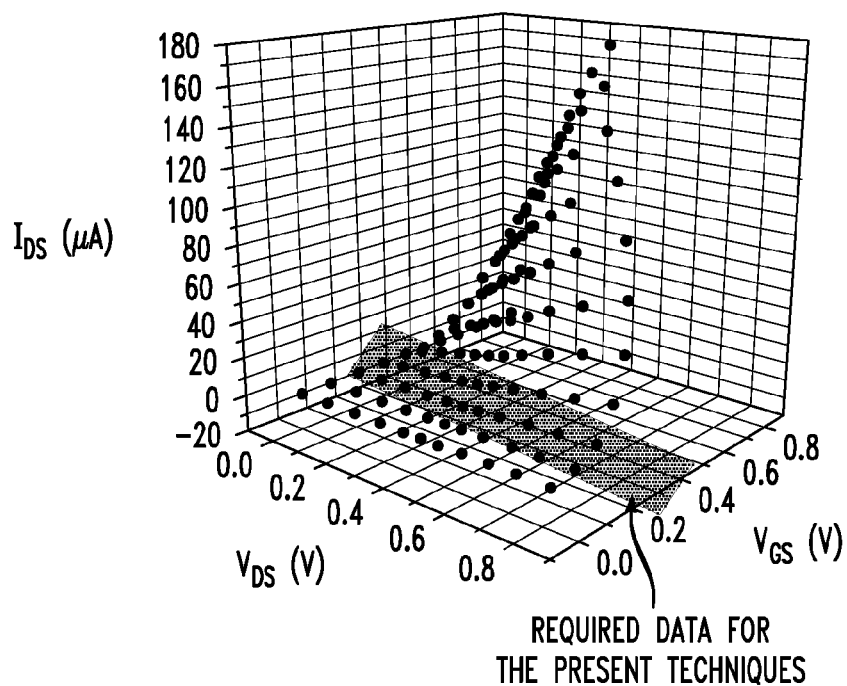
FIG. 3 is a diagram illustrating an exemplary error table showing the vectors required for the present techniques versus conventional table-look-up models according to an embodiment of the present invention.

FIG. 3 is a diagram illustrating exemplary error table 300 showing the vectors required for the present techniques versus conventional table-look-up models. In table 300, drain-source current ($I_{DS}$) (measured in microamps (μA)) is plotted as a function of drain-source voltage ($V_{DS}$) and gate-source voltage ($V_{GS}$) (both measured in volts (V)). As can be seen, table-look-up for the error in specific "critical" regions is much more compact than with a full table-look-up model (i.e., highlighted portion versus entire table 300, respectively). Since the discrepancy (or error) in some regions (i.e., the "critical" regions) is only for certain ranges, the number of rows in the "compact" table are noticeably reduced as compared to the full table. The present "compact" error tables can model the error in terms of a smaller set of critical variables, i.e., those variables associated with the critical regions resulting in low dimensional tables. Furthermore, such modeled portions can be reusable.

By comparison, conventional "full" table-based models have following disadvantages. First, a lot of characterization is needed over different operating condition and multi-dimensional variables. Second, fine interpolation is required for nonlinear elements. Third, dense interpolation can cause speed issues. Fourth, extrapolation is a definite problem.

Figure 4:
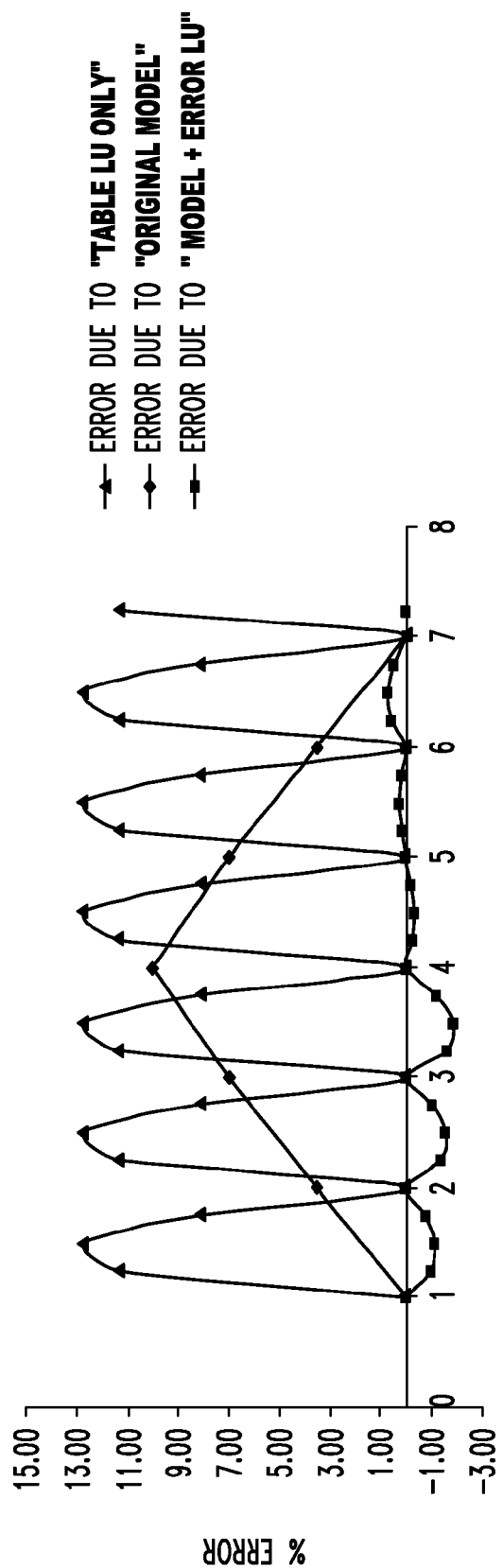
FIG. 4 is a graph illustrating percent (%) error for the present techniques vis-à-vis conventional techniques according to an embodiment of the present invention.

FIG. 4 is a graph 400 illustrating % error (predicted) for the present techniques (model+error look-up (LU)) vis-à-vis conventional physics-based model (original model) and strict table-look-up (LU) only techniques. Adding error look-up to the model assumes model error, that the error is an exponential function (see above) and that model+error look-up is much better (see, for example, graph 400) than look up alone. Also, as shown in FIG. 4, for the same table sizes, using a model+error look-up is better, i.e., has less error, than replacing a given region with only table-look-up.

Figure 5:
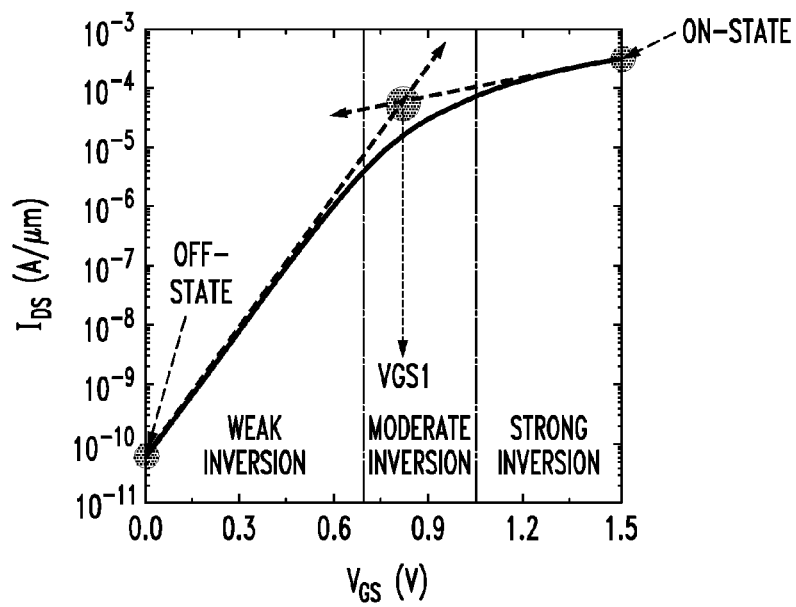
FIGS. 5-7 are diagrams illustrating exemplary methodologies that may be used to find a moderate inversion region of a field-effect transistor (FET) where compact error tables are required according to an embodiment of the present invention.
Figure 6:
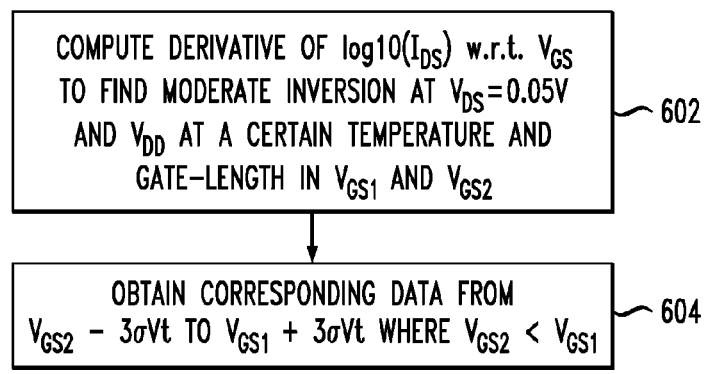
Figure 7:
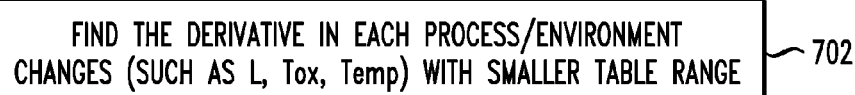

FIGS. 5-7 are diagrams illustrating exemplary methodologies that may be used to find the moderate inversion region of a FET (i.e., regions where the compact error tables are required). Specifically, FIG. 5 will be used in conjunction with FIG. 6 to describe a first methodology to find the moderate inversion region of a FET, and then FIG. 5 will be used in conjunction with FIG. 7 to describe a second methodology to find the moderate inversion region of a FET. The regions identified using either proposed method can be used for error collection according to the present techniques (see above).

FIG. 5 is a graph 500 illustrating the voltage-current characteristics of a FET. In graph 500, gate-source voltage ($V_{GS}$) (measured in volts (V)) is plotted on the x-axis and drain-source current ($I_{DS}$) (measured in amps per micrometer (A/μm)) is plotted on the y-axis.

FIG. 6 is a diagram illustrating exemplary methodology 600 to find the moderate inversion region of a FET. In step 602, the derivative of log $10(I_{DS})$ with respect to (w.r.t.) $V_{GS}$ (see FIG. 5) is computed to find moderate inversion at drain-source voltage ($V_{DS}$)=0.05V and supply voltage ($V_{DD}$) at a certain temperature (i.e., 85° C.) and with gate length (L) (i.e., nominal) in $V_{GS1}$ and $V_{GS2}$. In step 604, the data from $V_{GS2}$–3σVt to $V_{GS1}$+3σVt, wherein Vt is threshold voltage and $V_{GS2} < V_{GS1}$, is obtained. According to the present teachings, the data supplied for these moderate inversion regions are obtained from the compact error tables, which as described above serves to increase the accuracy of the simulation in such "critical" regions of the design. Methodology 600 is 'global' in the sense that the process uses a few parameters, e.g., ($V_{DS}$)=0.05V, that are global to different areas/regions of the design.

FIG. 7 is a diagram illustrating exemplary methodology 700 to find the moderate inversion region of a FET. In step 702, the derivative of log $10(I_{DS})$ w.r.t. $V_{GS}$ (see FIG. 6) is computed in each process/environment change (such as gate length (L), gate-insulator thickness (Tox), temperature, etc.) with smaller table range. According to the present teachings, the data supplied for these moderate inversion regions is obtained from the compact error tables, which as described above serve to increase the accuracy of the simulation in such "critical" regions of the design. Methodology 700 is 'local' in the sense that the process uses a variety of parameters, e.g., ($V_{DS}$)=0.05V, 1.0V, 1.5V, etc., that are local to a particular area/region of the design (hence a smaller table range). Methodology 700 will typically provide a more precise result than methodology 600, although there would likely be a trade-off in terms run-time for a greater level of accuracy.

Figure 8:
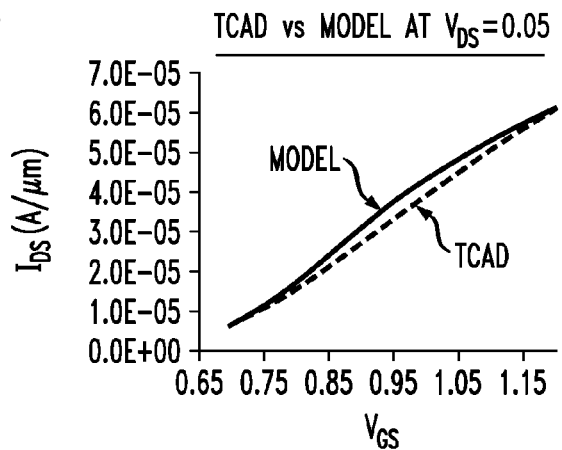
FIG. 8 is a graph illustrating drain-source current ($I_{DS}$) versus gate-source voltage ($V_{GS}$) for a FET according to an embodiment of the present invention.
Figure 9:
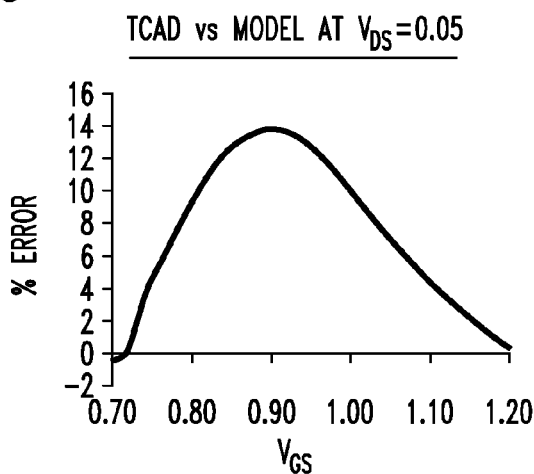
FIG. 9 is a graph illustrating % error versus $V_{GS}$ according to an embodiment of the present invention.

FIG. 8 is a graph 800 illustrating drain-source current ($I_{DS}$) (measured in A/μm) versus gate-source voltage ($V_{GS}$) for a FET. FIG. 9 is a graph 900 illustrating % error versus gate-source voltage ($V_{GS}$). Technology computer-aided design (TCAD) results are shown for comparison. TCAD is an accurate simulation tool, but has a slow run-time. FIGS. 8 and 9 clearly show that a, e.g., SPICE, model that is optimized for minimum error, works well in most regions, but has some error that still needs to be adjusted, particularly for specific applications.

Figure 10:
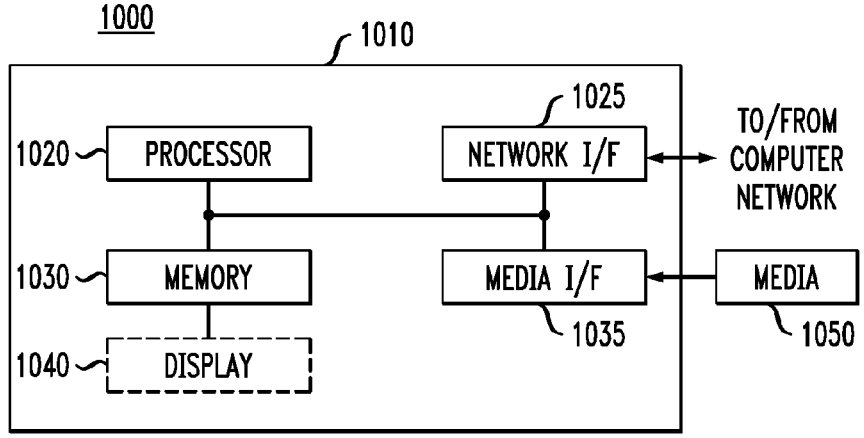
FIG. 10 is a diagram illustrating an exemplary apparatus for electronic circuit design simulation according to an embodiment of the present invention.

Turning now to FIG. 10, a block diagram is shown of an apparatus 1000 for electronic circuit design simulation, in accordance with one embodiment of the present invention. It should be understood that apparatus 1000 represents one embodiment for implementing methodology 100 of FIG. 1.

Apparatus 1000 comprises a computer system 1010 and removable media 1050. Computer system 1010 comprises a processor device 1020, a network interface 1025, a memory 1030, a media interface 1035 and an optional display 1040. Network interface 1025 allows computer system 1010 to connect to a network, while media interface 1035 allows computer system 1010 to interact with media, such as a hard drive or removable media 1050.

As is known in the art, the methods and apparatus discussed herein may be distributed as an article of manufacture that itself comprises a machine-readable medium containing one or more programs which when executed implement embodiments of the present invention. For instance, the machine-readable medium may contain a program configured to create a model of the circuit design; create error tables containing data related to one or more regions of the circuit design; modify the model with data from the error tables; and use the modified model to simulate the circuit design.

The machine-readable medium may be a recordable medium (e.g., floppy disks, hard drive, optical disks such as removable media 1050, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1020 can be configured to implement the methods, steps, and functions disclosed herein. The memory 1030 could be distributed or local and the processor device 1020 could be distributed or singular. The memory 1030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1020. With this definition, information on a network, accessible through network interface 1025, is still within memory 1030 because the processor device 1020 can retrieve the information from the network. It should be noted that each distributed processor that makes up processor device 1020 generally contains its own addressable memory space. It should also be noted that some or all of computer system 1010 can be incorporated into an application-specific or general-use integrated circuit.

Optional video display 1040 is any type of video display suitable for interacting with a human user of apparatus 1000. Generally, video display 1040 is a computer monitor or other similar video display.

In conclusion, a compact error correction table method is presented herein, which is fast, accurate and compatibility to statistical methodologies. Methods can be combined and used with accuracy of hardware (and/or TCAD), physics-based models, and table-look-up data. The present techniques are not limited to specific systems, but can be used for product design and yield analysis in terms of SRAM, eDRAM and logic circuits.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A computer-implemented method for electronic circuit design simulation, comprising the steps of:

creating a model of the circuit design;

creating error tables containing physics-based numerical solver-simulated data based on physical drift-diffusion or hydrodynamic transports of one or more regions of error of the circuit design, wherein the physics-based numerical solver-simulated data comprises at least one of gate-source voltage ($V_{GS}$), drain-source voltage ($V_{DS}$) and drain-source current ($I_{DS}$) data, and wherein the one or more regions of error are defined from a derivative of $I_{Ds}$ with respect to $V_{Gs}$ at device ON and OFF states;

modifying the model with the data of the one or more regions of error of the circuit design from the error tables; and using the modified model to simulate the circuit design, wherein at least one of the steps is carried out using a computer device.

2. The method of claim 1, further comprising the step of: obtaining data related to the circuit design.

3. The method of claim 1, wherein the model is a physics-based model.

4. The method of claim 1, wherein the model is a simulation program with integrated circuit emphasis (SPICE) model.

5. The method of claim 1, further comprising the step of: using the model to predict attributes of the circuit design.

6. The method of claim 5, wherein the attributes of the circuit design comprise one or more of performance, stability and power.

7. The method of claim 5, further comprising the step of: comparing the model predictions with the data in the error tables.

8. The method of claim 1, further comprising the step of: identifying the one or more regions of the circuit design for which the error tables are created.

9. The method of claim 1, further comprising the step of: creating error tables relating to one or more regions of the circuit design that correspond to regions of error in the model.

10. The method of claim 1, wherein not all regions of the circuit design are the regions of error.

11. A non-transitory article of manufacture for electronic circuit design simulation, comprising a machine-readable medium containing one or more programs which when executed implement the steps of:

creating a model of the circuit design;

creating error tables containing physics-based numerical solver-simulated data based on physical drift-diffusion or hydrodynamic transports of one or more regions of error of the circuit design, wherein the physics-based numerical solver-simulated data comprises at least one of gate-source voltage ($V_{GS}$), drain-source voltage ($V_{DS}$) and drain-source current ($I_{DS}$) data, and wherein the one or more regions of error are defined from a derivative of $I_{DS}$ with respect to $V_{GS}$ at device ON and OFF states;

modifying the model with the data of the one or more regions of error of the circuit design from the error tables; and using the modified model to simulate the circuit design.

12. The article of manufacture of claim 11, wherein the one or more programs which when executed further implement the step of:

obtaining data related to the circuit design.

13. The article of manufacture of claim 11, wherein the one or more programs which when executed further implement the step of:

using the model to predict attributes of the circuit design.

14. The article of manufacture of claim 13, wherein the one or more programs which when executed further implement the step of:

comparing the model predictions with the data in the error tables.

15. An apparatus for electronic circuit design simulation, the apparatus comprising:
a memory; and
at least one processor device, coupled to the memory, operative to:
create a model of the circuit design;
create error tables containing physics-based numerical solver-simulated data based on physical drift-diffusion or hydrodynamic transports of one or more regions of error of the circuit design, wherein the physics-based numerical solver-simulated data comprises at least one of gate-source voltage ($V_{GS}$), drain-source voltage ($V_{DS}$) and drain-source current ($I_{DS}$) data, and wherein the one or more regions of error are defined from a derivative of $I_{DS}$ with respect to $V_{GS}$ at device ON and OFF states;
modify the model with the data of the one or more regions of error of the circuit design from the error tables; and
use the modified model to simulate the circuit design.

16. The apparatus of claim 15, wherein the at least one processor device is further operative to:
obtain data related to the circuit design.

17. The apparatus of claim 15, wherein the at least one processor device is further operative to:
use the model to predict attributes of the circuit design.

18. The apparatus of claim 17, wherein the at least one processor device is further operative to:
compare the model predictions with the data in the error tables.

* * * * *